United States Patent
Chen

(10) Patent No.: US 9,906,161 B1
(45) Date of Patent: Feb. 27, 2018

(54) POWER CONVERSION APPARATUS

(71) Applicant: GREEN SOLUTION TECHNOLOGY CO., LTD., New Taipei (TW)

(72) Inventor: Chi-Lin Chen, New Taipei (TW)

(73) Assignee: GREEN SOLUTION TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/636,652

(22) Filed: Jun. 29, 2017

(30) Foreign Application Priority Data

Sep. 29, 2016 (TW) .............................. 105131196 A

(51) Int. Cl.
| | | |
|---|---|---|
| *H02M 7/217* | (2006.01) | |
| *H02M 3/335* | (2006.01) | |
| *H01L 29/772* | (2006.01) | |
| *H02M 1/16* | (2006.01) | |

(52) U.S. Cl.
CPC ........ *H02M 7/217* (2013.01); *H01L 29/7722* (2013.01); *H02M 1/16* (2013.01); *H02M 3/3353* (2013.01); *H02M 3/33553* (2013.01); *H02M 3/33576* (2013.01); *H02M 3/33592* (2013.01)

(58) Field of Classification Search
CPC ...... H02M 7/217; H02M 1/16; H02M 3/3353; H02M 3/33553; H02M 3/33576; H02M 3/33592; H01L 29/7722
See application file for complete search history.

(56) References Cited

U.S. PATENT DOCUMENTS

| | | | |
|---|---|---|---|
| 5,736,890 A | 4/1998 | Yee et al. | |
| 6,055,170 A | 4/2000 | Yee | |
| 6,091,234 A | 7/2000 | Kitagawa | |
| 7,768,808 B2 | 8/2010 | Soldano | |
| 8,040,698 B2 * | 10/2011 | Hyuugaji | H02M 3/33592 363/21.14 |
| 8,411,470 B2 | 4/2013 | Sato | |
| 2011/0075464 A1 * | 3/2011 | Sato | H02M 3/33592 363/127 |
| 2015/0280584 A1 * | 10/2015 | Gong | H02M 3/33515 363/21.13 |
| 2015/0365006 A1 * | 12/2015 | Choi | H02M 3/33592 363/21.02 |
| 2016/0190947 A1 * | 6/2016 | Shein | H02M 3/33592 363/21.14 |

FOREIGN PATENT DOCUMENTS

TW    I543518    7/2016

OTHER PUBLICATIONS

"Office Action of Taiwan Counterpart Application," dated Jul. 4, 2017, p. 1-p. 4, in which the listed references were cited.

* cited by examiner

*Primary Examiner* — Jue Zhang
(74) *Attorney, Agent, or Firm* — JCIPRNET

(57) ABSTRACT

A power conversion apparatus including a transformer, a synchronous rectification (SR) transistor and a SR controller is provided. The SR transistor is coupled between a secondary side of the transformer and an output terminal. The SR controller receives a cross voltage between a drain terminal and a source terminal of the SR transistor as a first detection signal. The SR controller obtains a first time length according to a voltage value of the first detection signal, a voltage value of a first trigger signal and a voltage value of a second trigger signal. The SR controller determines a time point to turn off the SR transistor according to the first time length.

10 Claims, 15 Drawing Sheets

POWER CONVERSION APPARATUS

CROSS-REFERENCE TO RELATED APPLICATION

This application claims the priority benefit of Taiwan application serial no. 105131196, filed on Sep. 29, 2016. The entirety of the above-mentioned patent application is hereby incorporated by reference herein and made a part of this specification.

BACKGROUND OF THE INVENTION

Field of the Invention

The invention relates to a power apparatus, and particularly relates to a power conversion apparatus.

Description of Related Art

A power conversion apparatus is an indispensible element in modern electronic apparatus. In the power conversion apparatus based on pulse width modulation (PWM) control, a secondary side of the power conversion apparatus generally has a rectifier diode. Since power consumption of the rectifier diode is relatively large under a turn-on state, a synchronous rectification transistor with a smaller turn-on resistance can be adopted to replace the rectifier diode, so as to improve a conversion efficiency of the power conversion apparatus. Under such structure, a synchronous rectification controller is still required to control turning on/off of the synchronous rectification transistor of the secondary side.

Generally, when the synchronous rectification transistor of the secondary side of the power conversion apparatus is turned on, the synchronous rectification controller may turn off the synchronous rectification transistor when a cross voltage ($V_{DS}$) between a drain and a source of the synchronous rectification transistor reaches 0 volt. However, since the cross voltage between the drain and the source of the synchronous rectification transistor generally has a noise, when the cross voltage $V_{DS}$ approaches to 0 volt, it is especially susceptible to interference. The above noise may result in a fact that the synchronous rectification controller cannot correctly determine a time point for turning off the synchronous rectification transistor, such that the conversion efficiency of the power conversion apparatus is decreased. More seriously, the above situation may further result in a fact that a power switch of a primary side of the power conversion apparatus and the synchronous rectification transistor of the secondary side are simultaneously turned on, which may probably damage internal circuit components of the power conversion apparatus.

SUMMARY OF THE INVENTION

The invention is directed to a power conversion apparatus. A synchronous rectification (SR) controller in the power conversion apparatus is adapted to deduce a time length that a cross voltage ($V_{DS}$) between a drain and a source of a SR transistor reaches each voltage value through a geometric manner, so as to determine a time point for turning off the SR transistor, such that the influence on the time point caused by a noise on the cross voltage $V_{DS}$ is reduced.

The invention provides a power conversion apparatus including a transformer, at least one synchronous rectification (SR) transistor and at least one SR controller. The transformer has a primary side and at least one secondary side, where the primary side is used for receiving an input voltage, and each of the secondary sides is used for providing an output voltage to a corresponding output terminal. Each of the SR transistors is coupled between one of the secondary sides of the transformer and the corresponding output terminal, and each of the SR transistors is controlled by a switch signal. Each of the SR controllers is coupled to the corresponding SR transistor, and receives a cross voltage between a drain terminal and a source terminal of the corresponding SR transistor to serve as a first detection signal. Each of the SR controllers obtains a first time length according to a voltage value of the first detection signal, a voltage value of a first trigger signal and a voltage value of a second trigger signal, and determines a second time length according to the first time length. Each of the SR controllers starts counting when the voltage value of the first detection signal is equal to the voltage value of the first trigger signal, and generates the switch signal to turn off the corresponding SR transistor when a counting value counted by the synchronous rectification controller reaches a sum of the first time length and the second time length.

According to the above description, the SR controller of the embodiment of the invention is adapted to obtain the first time length according to the voltage value of the first detection signal, the voltage value of the first trigger signal and the voltage value of the second trigger signal, and then deduces a time point for turning off the SR transistor according to the first time length. Since the first detection signal has a larger noise when the voltage value thereof is increased to approach 0 volt, in determination of the time point for turning off the SR transistor, the SR controller of the invention is adapted to decrease the influence caused by the above noise.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
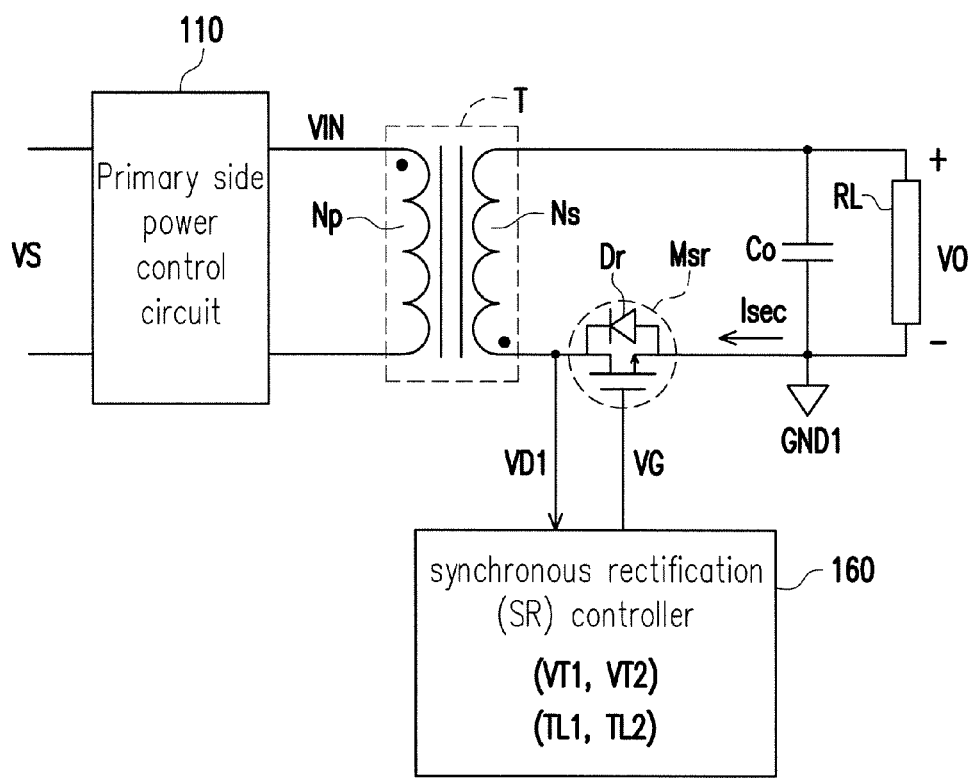
FIG. 1 is a circuit schematic diagram of a power conversion apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a circuit schematic diagram of a power conversion apparatus 100 according to an embodiment of the invention. Referring to FIG. 1, the power conversion apparatus 100 may include a primary side power control circuit 110, a transformer T, M synchronous rectification (SR) transistors Msr and M SR controllers 160, where the transformer T may include a primary side Np and M secondary sides Ns. In the exemplary embodiment of the invention, M can be a positive integer greater than or equal to 1, and for simplicity's sake, it is assumed that M is equal to 1, and the exemplary embodiment of M being greater than 1 can be deduced according to following description.

A first terminal of the primary side power control circuit 110 is used for receiving a power voltage VS, where the power voltage VS can be an alternating current (AC) voltage or a direct current (DC) voltage, which is determined according to an actual application or an actual design requirement. A second terminal of the primary side power control circuit 110 is coupled to two terminals of the primary side Np. The primary side power control circuit 110 is configured to perform a power conversion on the power voltage VS to generate an input voltage VIN, and provide the input voltage VIN to a first terminal (for example, a common-polarity terminal, i.e. the terminal illustrated with a dot) of the primary side Np. The primary side power control circuit 110 is, for example, an AC to DC conversion circuit or a DC to DC conversion circuit, though the invention is not limited thereto.

The first terminal of the primary side Np can be used for receiving the input voltage VIN, and a first terminal (for example, an opposite-polarity terminal, i.e. the terminal not illustrated with a dot) of the secondary side Ns is used for providing an output voltage VO to the output terminal or a load RL (for example, an electronic device), though the invention is not limited thereto.

A drain terminal of the SR transistor Msr is coupled to a second terminal (for example, a common-polarity terminal) of the secondary side Ns. A source terminal of the SR transistor Msr is coupled to a first ground terminal GND1. A gate of the SR transistor Msr receives a switch signal VG. The SR controller 160 is coupled to the corresponding SR transistor Msr. The SR controller 160 receives a cross voltage between the drain terminal and the source terminal of the SR transistor Msr to serve as a first detection signal VD1. The SR controller 160 obtains a first time length TL1 according to a voltage value of the first detection signal VD1, a voltage value of a first trigger signal VT1 and a voltage value of a second trigger signal VT2, and determines a second time length TL2 according to the first time length TL1. The SR controller 160 starts counting when the voltage value of the first detection signal VD1 is equal to the voltage value of the first trigger signal VT1, and generates the switch signal VG to turn off the SR transistor Msr when a counting value counted by the SR controller 160 reaches a sum of the first time length TL1 and the second time length TL2, which is described in detail later.

Figure 2:
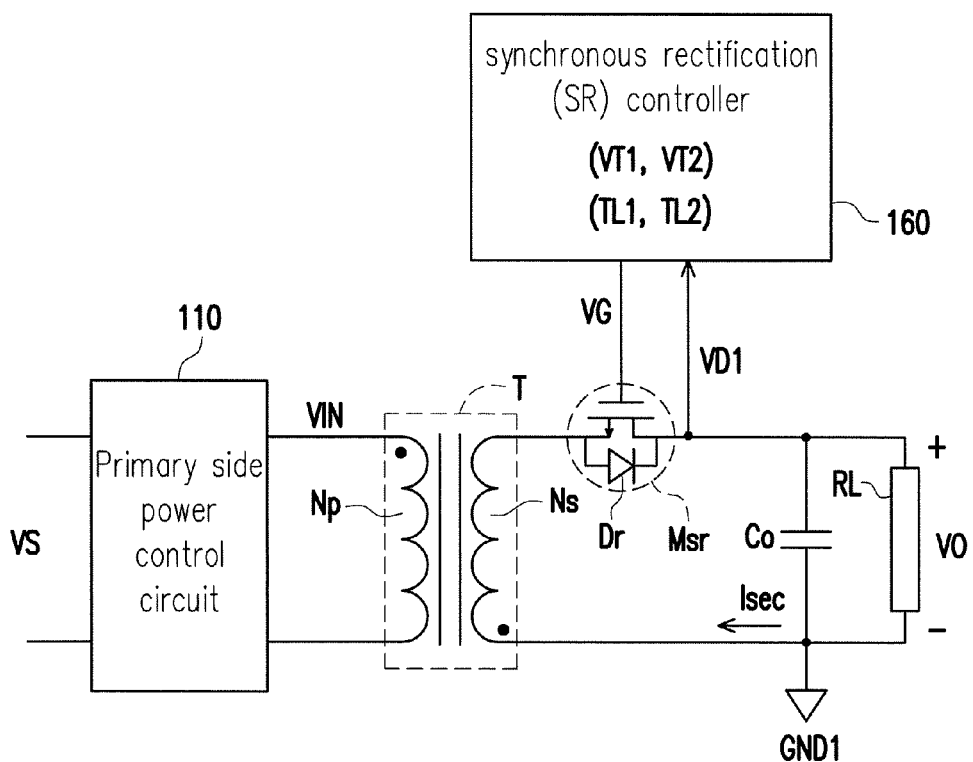
FIG. 2 is a circuit schematic diagram of a power conversion apparatus according to another embodiment of the invention.

FIG. 2 is a circuit schematic diagram of a power conversion apparatus 200 according to another embodiment of the invention. Referring to FIG. 1 and FIG. 2, similar to the power conversion apparatus 100 of FIG. 1, the power conversion apparatus 200 of FIG. 2 also includes the primary side power control circuit 110, the transformer T, the M SR transistors Msr and M SR controllers 160, where the transformer T also includes the primary side Np and M secondary sides Ns, where M can be a positive integer greater than or equal to 1, and for simplicity's sake, it is assumed that M is equal to 1.

Compared to the design of FIG. 1 that the drain terminal of the SR transistor Msr is coupled to the second terminal (for example, the common-polarity terminal) of the secondary side Ns, and the source terminal of the SR transistor Msr is coupled to the first ground terminal GND1, the source terminal of the SR transistor Msr of FIG. 2 is coupled to the first terminal (the opposite-polarity terminal) of the secondary side Ns, and the drain terminal of the SR transistor Msr of FIG. 2 is coupled to the output terminal or the load RL. The coupling relation between the primary side Np of the transformer T and the primary side power control circuit 110 is the same to the embodiment of FIG. 1, so that related description of FIG. 1 can be referred, and detail thereof is not repeated.

Since implementation and operation of the SR controller 160 of FIG. 1 and the SR controller 160 of FIG. 2 are similar, only the SR controller 160 of FIG. 1 is taken as an example for description, and implementation and operation of the SR controller 160 of FIG. 2 can be deduced with reference of following description.

In an embodiment of the invention, the SR controller 160 can be hardware, firmware or software or machine executable program codes stored in a memory that can be loaded and executed by a micro-processor, a micro-controller or a digital signal processor (DSP). If the SR controller 160 is implemented by hardware, the SR controller 160 can be implemented by a single integrated circuit chip, or implemented by multiple circuit chips, which is not limited by the invention. The circuit chips or single integrated circuit chip can be implemented by an application specific integrated circuit (ASIC) or a field programmable gate array (FPGA). The aforementioned memory can be a random access memory, a read-only memory or a flash memory, etc.

Figure 3:
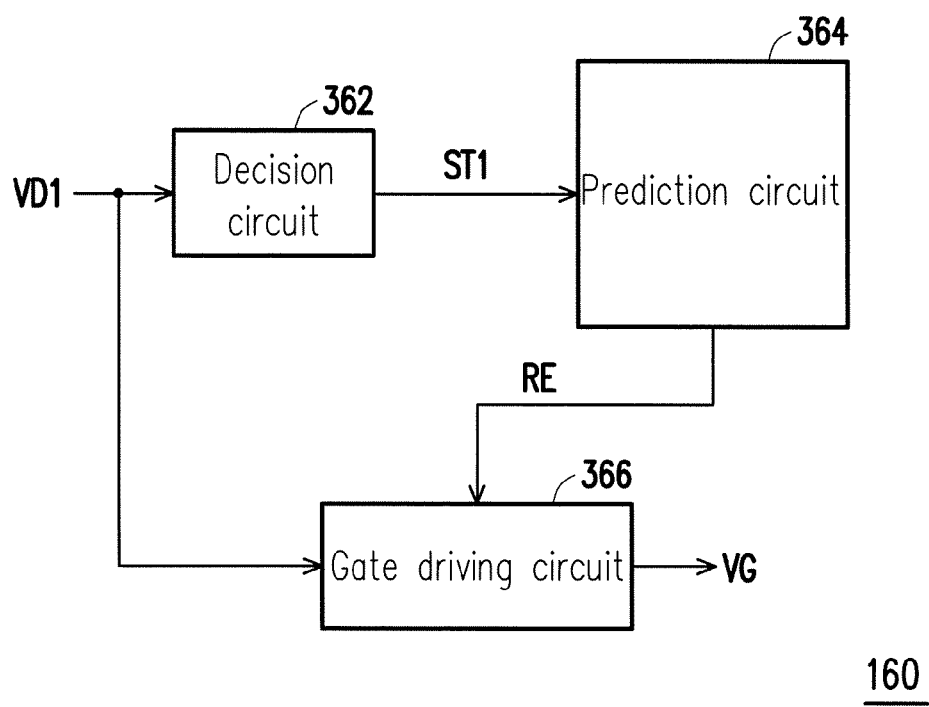
FIG. 3 is a circuit block schematic diagram of an SR controller of FIG. 1.
Figure 4:
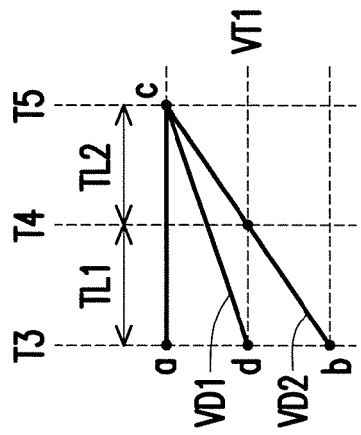
FIG. 4 is a signal timing schematic diagram of an SR controller according to an embodiment of the invention.
Figure 4:
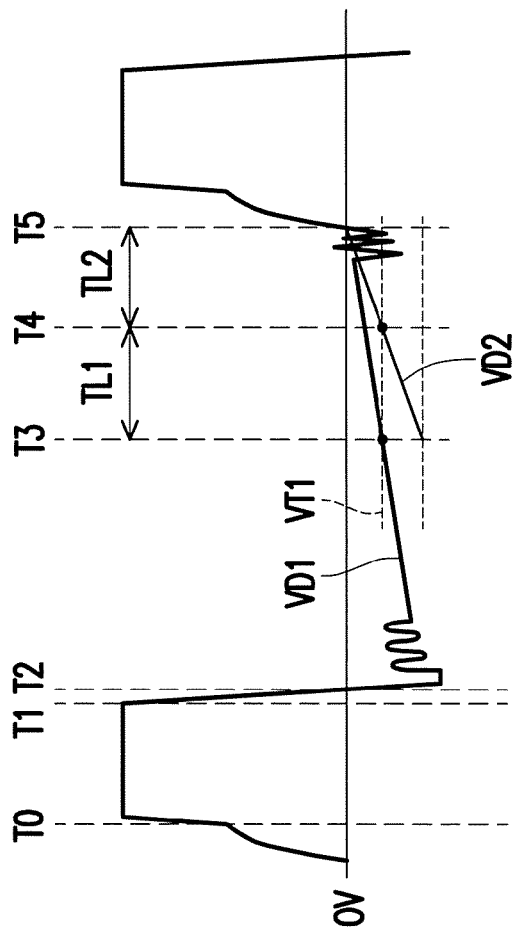

Further, referring to FIG. 1, FIG. 3 and FIG. 4, FIG. 3 is a circuit block schematic diagram of an SR controller 160 of FIG. 1, and FIG. 4 is a signal timing schematic diagram of the power conversion apparatus 100 according to an embodiment of the invention, where a vertical axis of FIG.

4 represents voltage, and a horizontal axis represents time. As shown in FIG. 3, the SR controller 160 may include a decision circuit 362, a prediction circuit 364 and a gate driving circuit 366. In the present embodiment, the second trigger signal VT2 (shown in FIG. 1) is the first trigger signal VT1. The decision circuit 362 is used for adjusting voltage value of the first detection signal VD1 to generate a second detection signal VD2. For simplicity's sake, only a part of waveform of the second detection signal VD2 is illustrated in FIG. 4, and the noise on the second detection signal VD2 is omitted. Moreover, a right part of FIG. 4 is a partial enlarged view of a left part of FIG. 4 from a time point T3 to a time point T5, and the noise on the first detection signal VD1 is omitted. The decision circuit 362 starts counting when the voltage value of the first detection signal VD1 is equal to the voltage value of the first trigger signal VT1, and stops counting when the voltage value of the second detection signal VD2 is equal to the voltage value of the first trigger signal VT1, so as to generate a decision signal ST1, where the decision signal ST1 is used for indicating the first time length TL1.

The prediction circuit 364 is coupled to the decision circuit 362 for receiving the decision signal ST1. The prediction circuit 364 obtains the first time length TL1 according to the decision signal ST1, and determines a second time length TL2 according to the first time length TL1. The prediction circuit 364 starts counting according to the decision signal ST1 at a time point when the first time length TL1 is ended, and generates a reset signal RE when a counting value counted by the prediction circuit 364 reaches the second time length TL2.

The gate driving circuit 366 is coupled to the prediction circuit 364 to receive the reset signal RE. The gate driving circuit 366 may generate a switch signal VG according to the reset signal RE, so as to turn off the corresponding SR transistor Msr.

In detail, referring to FIG. 1, FIG. 3-FIG. 5A, FIG. 5A is a circuit block schematic diagram of the decision circuit 362, the prediction circuit 364 and the gate driving circuit 366 of FIG. 3 according to an embodiment of the invention. The decision circuit 362 may include an amplifying circuit 3621, a first comparison circuit 3625, a second comparison circuit 3626 and a first time decision circuit 3627.

The amplifying circuit 3621 receives and outputs the first detection signal VD1, and amplifies the voltage value of the first direction signal VD1 to generate the second detection signal VD2. In an embodiment of the invention, the voltage value of the second direction signal VD2 can be twice of the voltage value of the first detection signal VD1, though the invention is not limited thereto, and the voltage value of the second direction signal VD2 can be determined according to an actual application or an actual design requirement. The first comparison circuit 3625 receives the first detection signal VD1 and the first trigger signal VT1, and compares the voltage value of the first detection signal VD1 with the voltage value of the first trigger signal VT1. When the voltage value of the first detection signal VD1 is equal to the voltage value of the first trigger signal VT1, the first comparison circuit 3625 generates a first setting signal SE1, where the first setting signal SE1 is used for indicating a time point for starting counting the first time length TL1.

The second comparison circuit 3626 receives the second detection signal VD2 and the first trigger signal VT1, and compares the voltage value of the second detection signal VD2 with the voltage value of the first trigger signal VT1. When the voltage value of the second detection signal VD2 is equal to the voltage value of the first trigger signal VT1, the second comparison circuit 3626 generates a second setting signal SE2, where the second setting signal SE2 is used for indicating a time point for stopping counting the first time length TL1 or a time point for starting counting the second time length TL2. The first time decision circuit 3627 receives the first setting signal SE1 and the second setting signal SE2, and accordingly generates the decision signal ST1.

The prediction circuit 364 may include a second time decision circuit 3647. In the present embodiment, the second time decision circuit 3647 is configured to obtain the first time length TL1 according to the decision signal ST1, and set the second time length TL2 to be equal to the first time length TL1. The second time decision circuit 3647 may start counting according to the second setting signal SE2 when the voltage value of the second detection signal VD2 is equal to the voltage value of the first trigger signal VT1, and generates a reset signal RE when a counting value counted by the second time decision circuit 3647 reaches the second time length TL2.

The gate driving circuit 366 includes a turn-on circuit 3667 and a driving circuit 3668. The turn-on circuit 3667 is configured to receive the first detection signal VD1 and a second reference voltage VR2. When the voltage value of the first detection signal VD1 is smaller than or equal to a voltage value of the second reference voltage VR2, the turn-on circuit 3667 generates a setting signal SE. The driving circuit 3668 is coupled to the turn-on circuit 3667 to receive the setting signal SE, and is coupled to the prediction circuit 364 to receive the reset signal RE. The driving circuit 3668 may generate a switch signal VG according to the setting signal SE, so as to turn on the SR transistor Msr. The driving circuit 3668 may generate the switch signal VG according to the reset signal RE, so as to turn off the corresponding SR transistor Msr. Detailed operations of the decision circuit 362, the prediction circuit 364 and the gate driving circuit 366 are described with reference of the signal timing diagram of FIG. 4.

In detail, at a time point T0, the input voltage VIN provided by the primary side power control circuit 110 may provide power to a coil of the primary side Np of the transformer T to store energy. Meanwhile, the SR transistor Msr and a parasitic diode Dr thereof are in a turn-off state. Therefore, the voltage level of the first detection signal VD1 can be K×VIN, where K is a coil ratio between the secondary side Ns and the primary side Np of the transformer T.

At a time point T1, the energy stored at the primary side Np of the transformer T is transferred to the secondary side Ns of the transformer T. Now, the voltage value of the first detection signal VD1 starts to decrease from K×VIN, and is finally decreased to a negative voltage value. When the voltage value of the first detection signal VD1 is decreased to be equal to or smaller than the second reference voltage VR2 (for example, 0 Volt, though the invention is not limited thereto, which is determined according to an actual application or an actual design requirement), the turn-on circuit 3667 of FIG. 5A generates the setting signal SE, and the driving circuit 3668 generates the switch signal VG to turn on the SR transistor Msr according to the setting signal SE, which is shown as the time point T2. Now, a current Isec (shown in FIG. 1) of the secondary side Ns of the transformer T flows from the source terminal of the SR transistor Msr to the drain terminal thereof through an internal induced channel, so that the energy transferred to the secondary side Ns of the transformer T may continuously charge a capacitor Co, so as to supply a DC output voltage Vo to the output terminal or the load RL.

As the energy stored by the secondary side Ns charges the capacitor Co, the current Isec of the secondary side Ns is decreased, such that the voltage levels of the first detection signal VD1 and the second detection signal VD2 are pulled up. When the voltage value of the first detection signal VD1 reaches the voltage value of the first trigger signal VT1, as shown by a time point T3, the first comparison circuit 3625 in the decision circuit 362 may generate the first setting signal SE1, and the first time decision circuit 3627 may generate the decision signal ST1 which is an enabled status (for example, a logic high level) according to the first setting signal SE1.

When the voltage value of the second detection signal VD2 reaches the voltage value of the first trigger signal VT1, as shown by a time point T4, the second comparison circuit 3626 in the decision circuit 362 may generate the second setting signal SE2, and the first time decision circuit 3627 may generate the decision signal ST1 which is a disabled status (for example, a logic low level) according to the second setting signal SE2. An enabling time length (i.e. a time length between the time point T3 and the time point T4) of the decision signal ST1 is the first time length TL1. It should be noted that since the voltage value of the second detection signal VD2 is the twice of the voltage value of the first detection signal VD1, in case that the first time length TL1 is known, the time point that the voltage value of the first detection signal VD1 is raised to 0 V can be deduced according to a triangular geometry operation. In detail, in a coordinate system shown in a right part of FIG. 4, a voltage vertical axis passing through the time point T3, a signal waveform of the second detection signal VD2 and a time horizontal axis are intersected to form three points a, b, c of a right triangle. Similarly, the voltage vertical axis passing through the time point T3, the signal waveform of the first detection signal VD1 and the time horizontal axis are intersected to form three points a, d, c of another right triangle. Since the voltage value represented by a line segment ab is twice of the voltage value represented by a line segment ad, it can be deduced that a time length (i.e. the second time length TL2) between the time points T4 and T5 is equal to a time length (i.e. the first time length TL1) between the time points T3 and T4. In this way, the time point (i.e. the time point T5) that the voltage value of the first detection signal VD1 is raised to 0 V can be obtained.

Therefore, at the time point T4, the second time decision circuit 3647 may obtain the first time length TL1 according to the decision signal ST1, and may set the second time length TL2 to be equal to the first time length TL1. Now, the second time decision circuit 3647 starts counting, and generates a reset signal RE when a counting value reaches the second time length TL2, and the driving circuit 3668 may generate the switch signal VG to turn off the SR transistor Msr according to the reset signal RE, as shown by the time point T5.

According to the left part of FIG. 4, it is known that there is a large noise when the voltage value of the first detection signal VD1 (or the second detection signal VD2) is increased to approach 0 V (i.e. to be near the time point T5), so that the SR controller 160 of the embodiment of the invention respectively compares the voltage values of the first detection signal VD1 and the second detection signal VD2 with the voltage value of the first trigger signal VT1 to obtain the first time length TL1, and then predicts the time point (i.e. the time point for turning off the SR transistor Msr) when the first detection signal VD1 reaches 0 V according to the first time length TL1 and the triangular geometry operation. In this way, the time point for turning off the SR transistor Msr can be correctly determined, so as to decrease the influence caused by the aforementioned noise. In an embodiment of the invention, the voltage value of the first trigger signal VT1 can be 30 mV, though the invention is not limited thereto, and the voltage value of the first trigger signal VT1 can be determined according to an actual application or an actual design requirement.

Figure 5A:
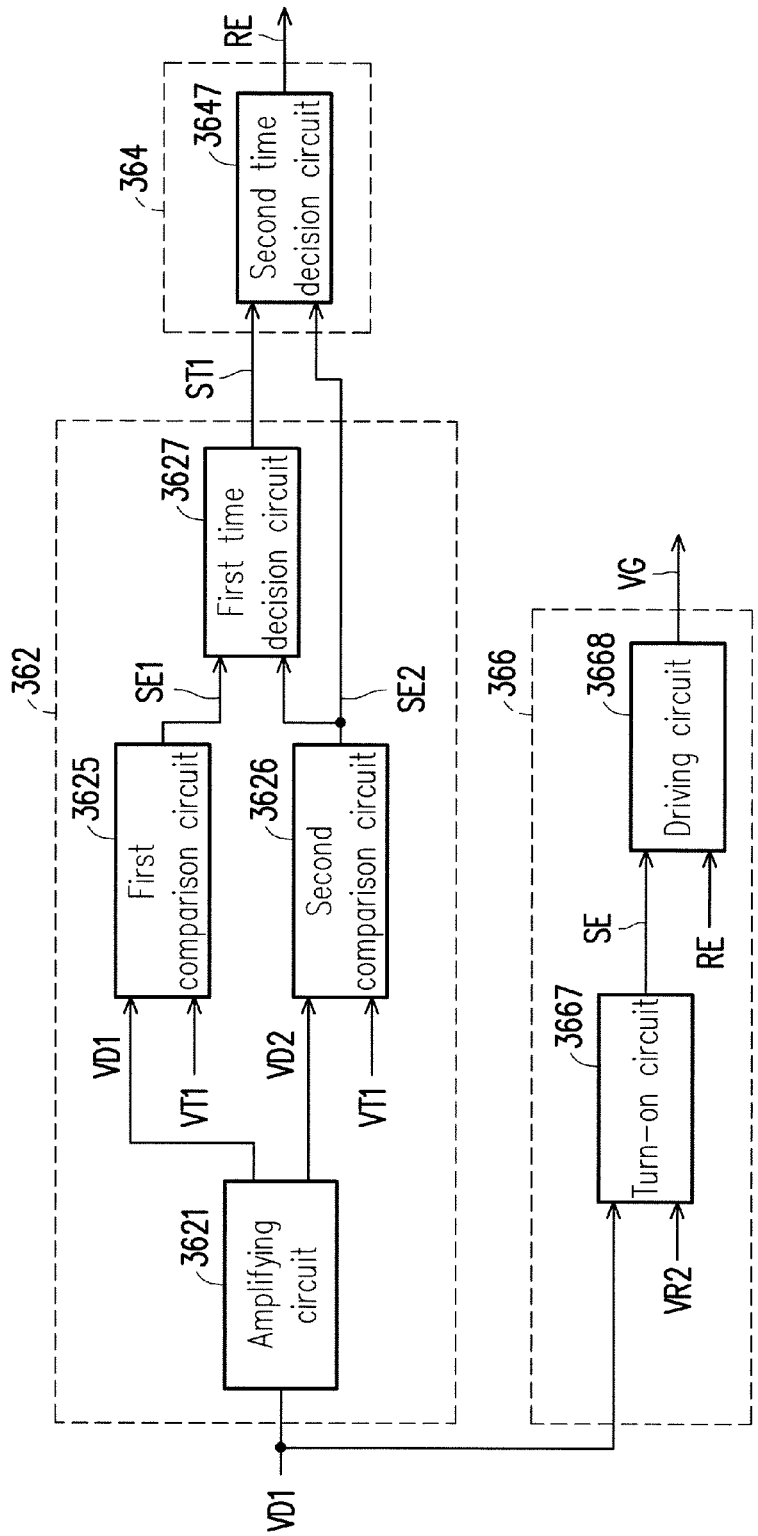
FIG. 5A is a circuit block schematic diagram of a decision circuit, a prediction circuit and a gate driving circuit of the SR controller according to an embodiment of the invention.
Figure 5B:
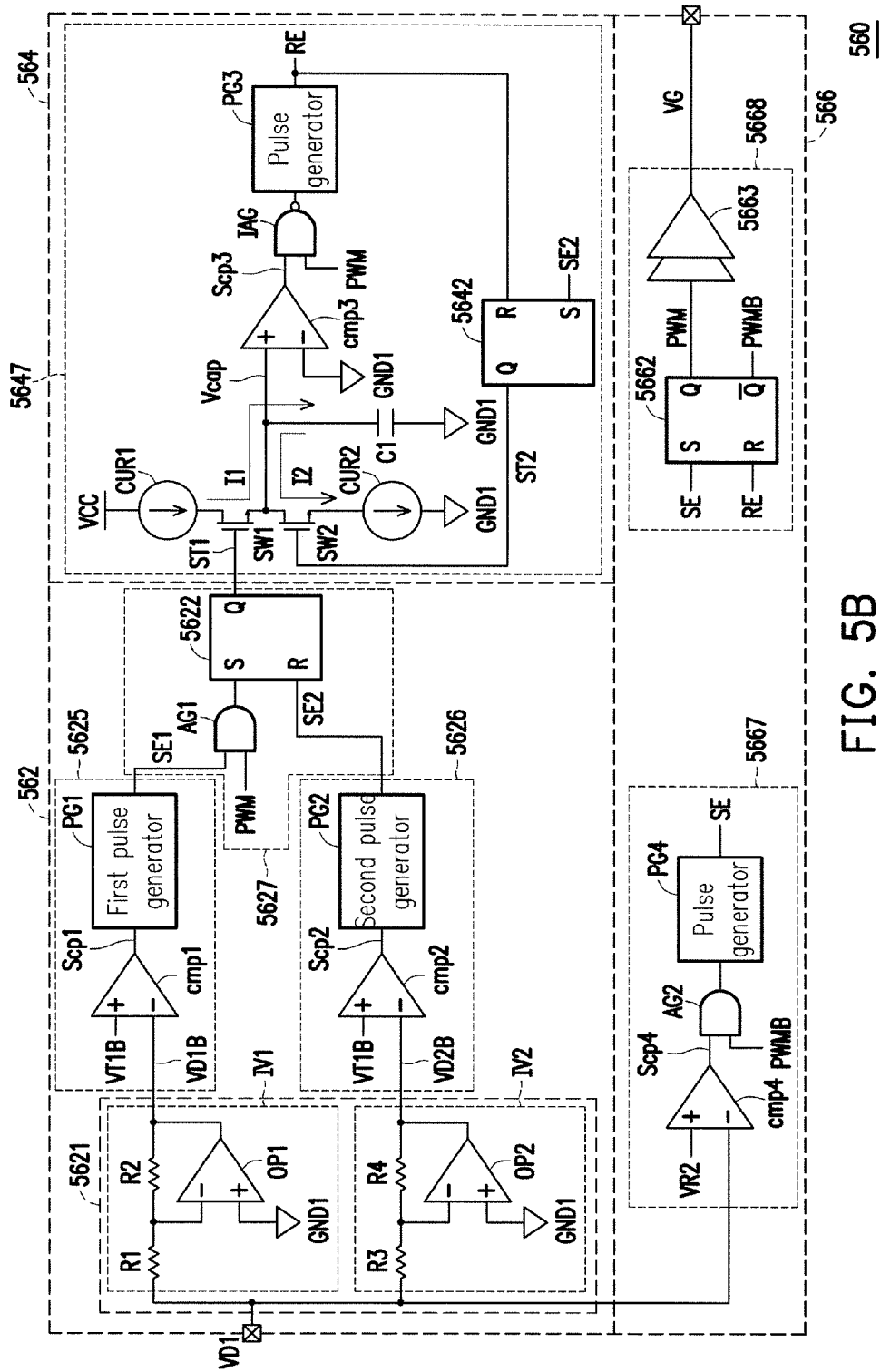
FIG. 5B is a schematic diagram of a circuit structure of the decision circuit, the prediction circuit and the gate driving circuit of the SR controller according to an embodiment of the invention.

Referring to FIG. 5B, FIG. 5B is a schematic diagram of a circuit structure of a decision circuit 562, a prediction circuit 564 and a gate driving circuit 566 of the SR controller 560 according to an embodiment of the invention, where the decision circuit 562, the prediction circuit 564 and the gate driving circuit 566 of FIG. 5B can be respectively a circuit implementation of the decision circuit 362, the prediction circuit 364 and the gate driving circuit 366 of FIG. 5A, though the invention is not limited thereto. The decision circuit 562 may include an amplifying circuit 5621, a first comparison circuit 5625, a second comparison circuit 5626 and a first time decision circuit 5627.

The amplifying circuit 5621 is configured to receive the first detection signal VD1, and generates an inverted first detection signal VD1B and an inverted second detection signal VD2B. Further, the amplifying circuit 5621 may include a first inverting amplifier IV1 and a second inverting amplifier IV2. The first inverting amplifier IV1 may include a first operation amplifier OP1, a first resistor R1 and a second resistor R2. A first terminal of the first resistor R1 receives the first detection signal VD1. A second terminal of the first resistor R1 is coupled to an inverted input terminal of the first operation amplifier OP1. A non-inverted input terminal of the first operation amplifier OP1 is coupled to a first ground terminal GND1. A first terminal of the second resistor R2 is coupled to the inverted input terminal of the first operation amplifier OP1. A second terminal of the second resistor R2 is coupled to an output terminal of the first operation amplifier OP1 to generate the inverted first detection signal VD1B, where a resistance of the second resistor R2 is equal to a resistance of the first resistor R1. It should be noted that an absolute gain value of the first inverting amplifier IV1 is 1.

The second inverting amplifier IV2 may include a second operation amplifier OP2, a third resistor R3 and a fourth resistor R4. A first terminal of the third resistor R3 receives the first detection signal VD1. A second terminal of the third resistor R3 is coupled to an inverted input terminal of the second operation amplifier OP2. A non-inverted input terminal of the second operation amplifier OP2 is coupled to the first ground terminal GND1. A first terminal of the fourth resistor R4 is coupled to the inverted input terminal of the second operation amplifier OP2. A second terminal of the fourth resistor R4 is coupled to an output terminal of the second operation amplifier OP2 to generate the inverted second detection signal VD2B. In an embodiment of the invention, a resistance of the fourth resistor R4 can be twice of a resistance of the third resistor R3. It should be noted that an absolute gain value of the second inverting amplifier IV2 is 2.

The first comparison circuit 5625 includes a first comparator cmp1 and a first pulse generator PG1. An inverted input terminal of the first comparator cmp1 receives the inverted first detection signal VD1B. A non-inverted input terminal of the first comparator cmp1 receives an inverted first trigger signal VT1B. An output terminal of the first comparator cmp1 generates a first comparison signal Scp1. The first pulse generator PG1 is coupled to the output terminal of the first comparator cmp1 to receive the first comparison signal Scp1, and accordingly generates the first setting signal SE1.

The second comparison circuit 5626 includes a second comparator cmp2 and a second pulse generator PG2. An inverted input terminal of the second comparator cmp2 receives the inverted second detection signal VD2B. A non-inverted input terminal of the second comparator cmp2 receives the inverted first trigger signal VT1B. An output terminal of the second comparator cmp2 generates a second comparison signal Scp2. The second pulse generator PG2 is coupled to the output terminal of the second comparator cmp2 to receive the second comparison signal Scp2, and accordingly generates the second setting signal SE2.

It should be noted that at the time point T2 shown in FIG. 4, the voltage of the first detection signal VD1 is changed from a positive voltage to a negative voltage, and to facilitate the first comparison circuit 5625 to perform voltage comparison, the embodiment of FIG. 5B adopts the first inverting amplifier IV1. In detail, the intention of using the first inverting amplifier IV1 is that the first detection signal VD1 (with a negative voltage) is converted into the inverted first detection signal VD B (with a positive voltage), and the positive voltage type inverted first detection signal VD B is provided to the inverted input terminal of the first comparator cmp1. Moreover, the non-inverted input terminal of the first comparator cmp1 receives the positive voltage type inverted first trigger signal VT1B, where the inverted first trigger signal VT1B (with a positive voltage) can be obtained by inverting the first trigger signal VT1 (with a negative voltage) by using an inverter (not shown). In this way, the first comparator cmp1 may compare the inverted first detection signal VD1B and the inverted first trigger signal VT1B that both have the positive voltage type, which is easy to be implemented, though the embodiment of the invention is not limited thereto. In other embodiments of the invention, the first comparator cmp1 may also directly compare the first detection signal VD1 and the first trigger signal VT1 that both have the negative voltage type, which is determined according to an actual application or an actual design requirement.

Similar to the implementation of the first inverting amplifier IV1, to facilitate the second comparison circuit 5626 to perform voltage comparison, the embodiment of FIG. 5B adopts the second inverting amplifier IV2. In detail, the intention of using the second inverting amplifier IV2 is that the first detection signal VD1 (with a negative voltage) is converted into a positive voltage and is then amplified by twice to serve as the inverted second detection signal VD2B (with the positive voltage), and the positive voltage type inverted second detection signal VD2B is provided to the inverted input terminal of the second comparator cmp2. Moreover, the non-inverted input terminal of the second comparator cmp2 receives the positive voltage type inverted first trigger signal VT1B, where the inverted first trigger signal VT1B (with a positive voltage) can be obtained by inverting the first trigger signal VT1 (with a negative voltage) by using an inverter (not shown). In this way, the second comparator cmp2 may compare the inverted second detection signal VD2B and the inverted first trigger signal VT1B that both have the positive voltage type, which is easy to be implemented, though the embodiment of the invention is not limited thereto. In other embodiments of the invention, the second comparator cmp2 may also directly compare the second detection signal VD2 and the first trigger signal VT1 that both have the negative voltage type, which is determined according to an actual application or an actual design requirement.

The first time decision circuit 5627 includes an AND gate AG1 and an SR latch 5622. A first input terminal of the AND gate AG1 is coupled to the first pulse generator PG1 to receive the first setting signal SE1. A second input terminal of the AND gate AG1 receives a pulse width modulation signal PWM. A setting terminal S of the SR latch 5622 is coupled to an output terminal of the AND gate AG1. A reset terminal R of the SR latch 5622 is coupled to the second pulse generator PG2 to receive the second setting signal SE2. A positive output terminal Q of the SR latch 5622 generates the decision signal ST1.

The prediction circuit 564 may include a second time decision circuit 5647. The second time decision circuit 5647 may include a charging switch SW1, a first current source CUR1, a discharging switch SW2, a second current source CUR2, a capacitor C1, a comparator cmp3, a NAND gate IAG, a pulse generator PG3 and an SR latch 5642. A control terminal of the charging switch SW1 receives the decision signal ST1. The first current source CUR1 is coupled between a power voltage VCC and a first terminal of the charging switch SW1, and is configured to generate a first current I1 to charge the capacitor C1 when the charging switch SW1 is turned on. A control terminal of the discharging switch SW2 receives a prediction signal ST2. A first terminal of the discharging switch SW2 is coupled to a second terminal of the charging switch SW1. The second current source CUR2 is coupled between a second terminal of the discharging switch SW2 and the first ground terminal GND1, and is configured to generate a second current I2 to discharge the capacitor C1 when the discharging switch SW2 is turned on, where a current value of the second current I2 is equal to a current value of the first current I1. A first terminal of the capacitor C1 is coupled to the second terminal of the charging switch SW1 to generate a first voltage Vcap. A second terminal of the capacitor C1 is coupled to the first ground terminal GND1.

A non-inverted input terminal of the comparator cmp3 is coupled to the first terminal of the capacitor C1 to receive the first voltage Vcap. An inverted input terminal of the comparator cmp3 is coupled to the first ground terminal GND1. An output terminal of the comparator cmp3 generates a comparison signal Scp3. A first input terminal of the NAND gate IAG is coupled to the output terminal of the comparator cmp3 to receive the comparison signal Scp3. A second input terminal of the NAND gate IAG receives the pulse width modulation signal PWM. An input terminal of the pulse generator PG3 is coupled to the output terminal of the NAND gate IAG. An output terminal of the pulse generator PG3 generates the reset signal RE. A setting terminal S of the SR latch 5642 receives the second setting signal SE2. A reset terminal R of the SR latch 5642 is coupled to the pulse generator PG3 to receive the reset signal RE. A positive output terminal Q of the SR latch 5642 generates the prediction signal ST2.

The gate driving circuit 566 may include a turn-on circuit 5667 and a driving circuit 5668. The turn-on circuit 5667 may include a comparator cmp4, an AND gate AG2 and a pulse generator PG4. A non-inverted input terminal of the comparator cmp4 is used for receiving a second reference voltage value VR2. An inverted input terminal of the comparator cmp4 is used for receiving the first detection signal VD1. An output terminal of the comparator cmp4 generates a comparison signal Scp4. A first input terminal of the AND gate AG2 is coupled to the output terminal of the comparator cmp4 to receive the comparison signal Scp4. A second input terminal of the AND gate AG2 receives an inverted pulse width modulation signal PWMB. The pulse generator PG4 is coupled to an output terminal of the AND gate AG2, and accordingly generates the setting signal SE.

The driving circuit 5668 may include a SR latch 5662 and an output buffer 5663. A setting terminal S of the SR latch 5662 is used for receiving the setting signal SE. A reset terminal R of the SR latch 5662 is used for receiving the reset signal RE. A positive output terminal Q of the SR latch 5662 generates the pulse width modulation signal PWM. An inverted output terminal /Q of the SR latch 5662 generates an inverted pulse width modulation signal PWMB. The output buffer 5663 receives the pulse width modulation signal PWM, and accordingly generates the switch signal VG.

Figure 6A:
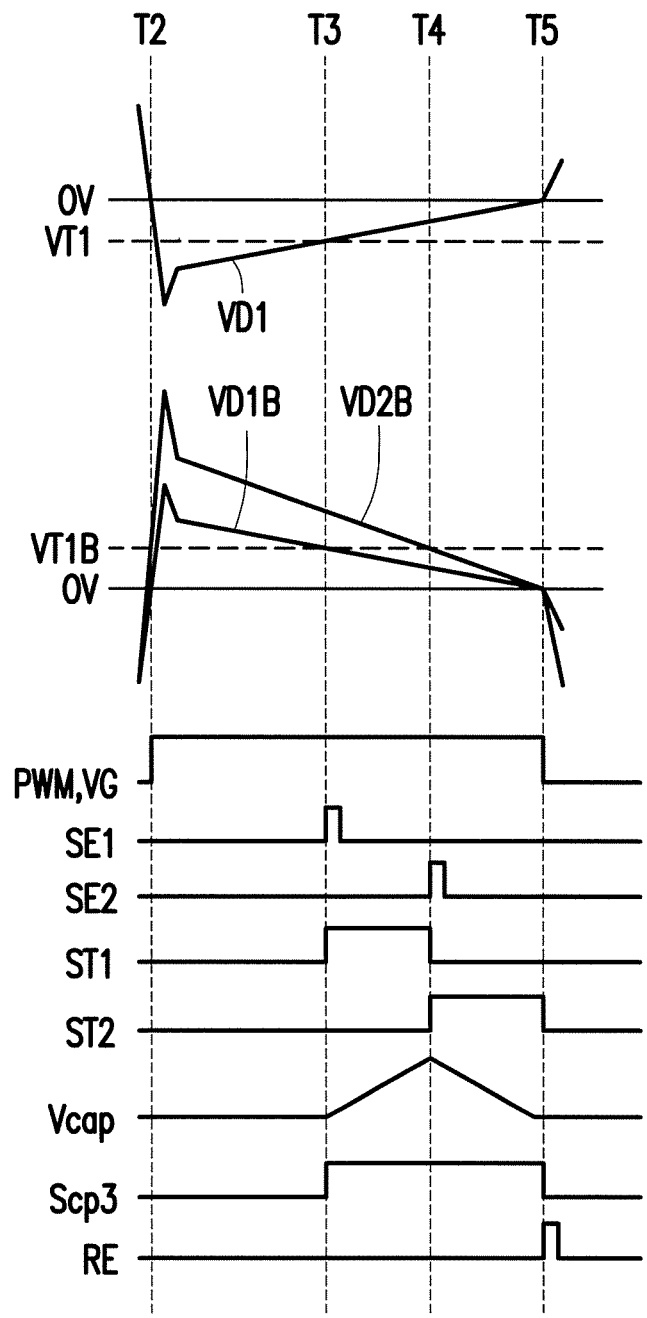
FIG. 6A is a signal timing schematic diagram of the SR controller of FIG. 5B.

The operation of the SR controller 560 of FIG. 5B is described below. Referring to FIG. 5B and FIG. 6A, FIG. 6A is a signal timing schematic diagram of the SR controller 560 of FIG. 5B, where time points T2-T5 of FIG. 6A may respectively correspond to the time points T2-T5 of FIG. 4. Before the time point T2, the pulse width modulation signal PWM (or the switch signal VG) is in a disabled state (for example, a logic low level), so that the SR transistor Msr is in a turn-off state. At the time point T2, the voltage value of the first detection signal VD1 is decreased to be equal to or smaller than the second reference voltage VR2 (for example, 0 V, though the invention is not limited thereto, which is determined according to an actual application or an actual design requirement), so that the comparator cmp4 may generate the enabled comparison signal Scp4 (for example, logic high level). In case that the comparison signal is in the enabled state and the pulse width modulation signal PWM is in the disabled state (i.e. the inverted pulse width modulation signal PWMB is in the enabled state), the AND gate AG2 and the pulse generator PG4 generate the setting signal SE. The setting signal SE sets the SR latch 5662, and the SR latch 5662 generates the enabled pulse width modulation signal PWM, and the output buffer 5663 outputs the enabled switch signal VG to turn on the SR transistor Msr.

On the other hand, the first inverting amplifier IV1 may invert the first detection signal VD1 to generate the inverted first detection signal VD1B; and the second inverting amplifier IV2 may amplify the first detection signal VD1 by twice and invert the same to generate the inverted second detection signal VD2B, though the invention is not limited thereto.

At the time point T3, the voltage value of the inverted first detection signal VD1B is smaller than or equal to the voltage value of the inverted first trigger signal VT1B, so that the first comparator cmp1 generates the enabled first comparison signal Scp1, and the first pulse generator PG1 generates the first setting signal SE1. The AND gate AG1 receives the first setting signal SE1 and in case that the pulse width modulation signal PWM is in the enabled state, the first setting signal SE1 sets the SR latch 5622, and the SR latch 5622 generates the enabled decision signal ST1 to turn on the charging switch SW1. Now, the first current source CUR1 starts to generate the first current I1 to charge the capacitor C1, and the first voltage Vcap is increased from a voltage value of the first ground terminal (for example, 0 V).

At the time point T4, the voltage value of the inverted second detection signal VD2B is smaller than or equal to the voltage value of the inverted first trigger signal VT1B, so that the second comparator cmp2 generates the enabled second comparison signal Scp2, and the second pulse generator PG2 generates the second setting signal SE2. The second setting signal SE2 resets the SR latch 5622, and the SR latch 5622 generates the disabled decision signal ST1 to turn off the charging switch SW1. Now, the first current source CUR1 stops charging the capacitor C1. On the other hand, the second setting signal SE2 may set the SR latch 5642, and the SR latch 5642 generates the enabled prediction signal ST2 to turn on the discharging switch SW2. Now, the second current source CUR2 starts to generate the second current I2 to discharge the capacitor C1, such that the first voltage Vcap starts to be decreased.

At the time point T5, the voltage value of the first voltage Vcap is smaller than or equal to the voltage value (for example, 0 V) of the first ground terminal, so that the third comparator cmp3 generates the disabled third comparison signal Scp3. The NAND gate IAG and the pulse generator PG3 generate the reset signal RE in case that the third comparison signal Scp3 is in the disabled state. The reset signal RE resets the SR latch 5642, and the SR latch 5642 generates the disabled prediction signal ST2 to turn off the discharging switch SW2. Now, the second current source CUR2 stops discharging the capacitor C1. On the other hand, the reset signal RE resets the SR latch 5662, and the SR latch 5662 generates the disabled pulse width modulation signal PWM, and the output buffer 5663 outputs the disabled switch signal VG to turn off the SR transistor Msr.

In overall, in the aforementioned embodiment, the first detection signal VD1 is amplified by twice to obtain the second detection signal VD2, and the time points T3 and T4 that the voltage value of the first detection signal VD1 and the voltage value of the second detection signal VD2 reach the voltage value of the first trigger signal VT1 are respectively recorded to obtain the first time length TL1. Then, the second time length TL2 is deduced to be equal to the first time length TL1 according to the triangular geometry operation, and it is started to count at the time point T4, and the SR transistor Msr is turned off after the counting value reaches the second time length TL2, though the invention is not limited thereto, and implementations of various variations are described below.

Figure 6B:
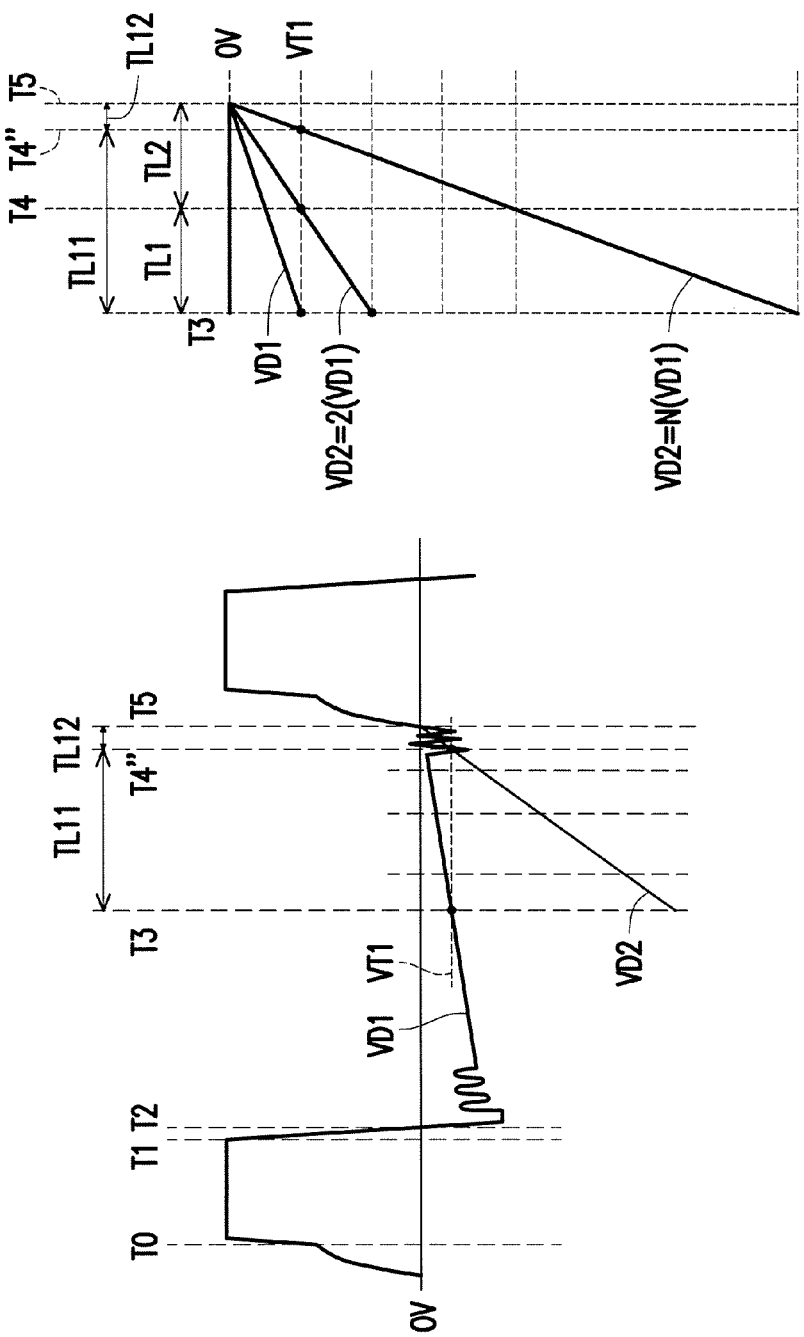
FIG. 6B is a signal timing schematic diagram of an SR controller according to another embodiment of the invention.

Referring to FIG. 5A and FIG. 6B, FIG. 6B is a signal timing schematic diagram of an SR controller according to another embodiment of the invention, where a vertical axis of FIG. 6B represents voltage, and a horizontal axis represents time. For simplicity's sake, only a part of a waveform of the second detection signal VD2 is illustrated in FIG. 6B, and the noise on the second detection signal VD2 is omitted. Moreover, a right part of FIG. 6B is a partial enlarged view of a left part of FIG. 6 from a time point T3 to a time point T5, and the noise on the first detection signal VD1 is omitted. In another embodiment of the invention, an amplifying factor of the amplifying circuit 3621 of FIG. 5A can be N, where N is a real number greater than 1. In other words, the voltage value of the second detection signal VD2 can be N times of the voltage value of the first detection signal VD1. Based on the aforementioned situation, the second time decision circuit 3647 may obtain the first time length TL11 according to the decision signal ST1, and set the second time length TL12 to be equal to 1/(N−1) times of the first time length TL11, where the second time decision circuit 3647 starts counting according to the second setting signal SE2 when the voltage value of the second detection signal VD2 is equal to the voltage value of the first trigger signal VT1, and generates the reset signal RE when the counting value counted by the second time decision circuit 364 reaches the second time length TL12.

Further, the time points that the voltage value of the first detection signal VD1 and the voltage value of the second detection signal VD2 (i.e. N(VD1)) reach the voltage value of the first trigger signal VT1 are respectively the time points T4 and T4'', where a relationship between the first time length TL11 of FIG. 6B and the first time length TL1 of FIG. 4 is shown as a following equation (1). Then, the second time length TL12 can be deduced according to the triangular geometry operation, as shown by a following equation (2), where the second time length TL12 is 1/(N−1) times of the first time length TL11.

$$TL11 = \left(\frac{N-1}{N}\right) \times 2 \times TL1 \qquad \text{equation (1)}$$

$$TL12 = \left(\frac{2}{N}\right) \times TL1 \qquad \text{equation (2)}$$

Based on the aforementioned situation, the resistance of the fourth resistor R4 of FIG. 5B can be N times of the resistance of the third resistor R3, so that the second inverting amplifier IV2 may amplify the first detection signal VD1 by N times and invert the same to generate the inverted second detection signal VD2B. Moreover, the current value of the second current I2 of FIG. 5B can be (N−1) times of the current value of the first current I1, so that the second time length TL12 can be 1/(N−1) times of the first time length TL11.

In another embodiment of the invention, the amplification factor of the amplifying circuit 3621 of FIG. 5A can be adjusted, where the amplification factor of the amplifying circuit 3621 can be determined according to an actual application or an actual design requirement. In other words, a multiple between the voltage value of the second detection signal VD2 and the voltage value of the first detection signal VD1 is adjustable. Based on the aforementioned situation, the fourth resistor R4 of the second inverting amplifier IV2 of FIG. 5B can be a variable resistor, where a resistance of the fourth resistor R4 can be fine tuned around twice of the resistance of the third resistor R3. It should be noted that an absolute gain value of the second inverting amplifier IV2 is a resistance ratio of the fourth resistor R4 and the third resistor R3. In an embodiment of the invention, the resistance ratio of the fourth resistor R4 and the third resistor R3 ranges between 1.9 and 2.1, though the invention is not limited thereto, which is determined according to an actual application or an actual design requirement.

In detail, since the amplification factor of the amplifying circuit 3621 of FIG. 5A is adjustable, the voltage value of the second detection signal VD2 generated by the amplifying circuit 3621 of FIG. 5A can be fine tuned, i.e. a slope of the second detection signal VD2 between the time points T3-T5 is fine tuned, such that an enabling time length (i.e. the first time length TL1) of the decision signal ST1 generated by the decision circuit 562 can be fine tuned. Moreover, an enabling time length (i.e. the second time length TL2) of the prediction signal ST2 generated by the prediction circuit 564 can be set to be equal to the first time length TL1. Therefore, the designer may adjust the second time length TL2 by adjusting the amplification factor of the amplifying circuit 3621, so as to adjust a turn-off time point of the SR transistor Msr. In this way, flexibility in circuit design is enhanced.

Figure 6C:
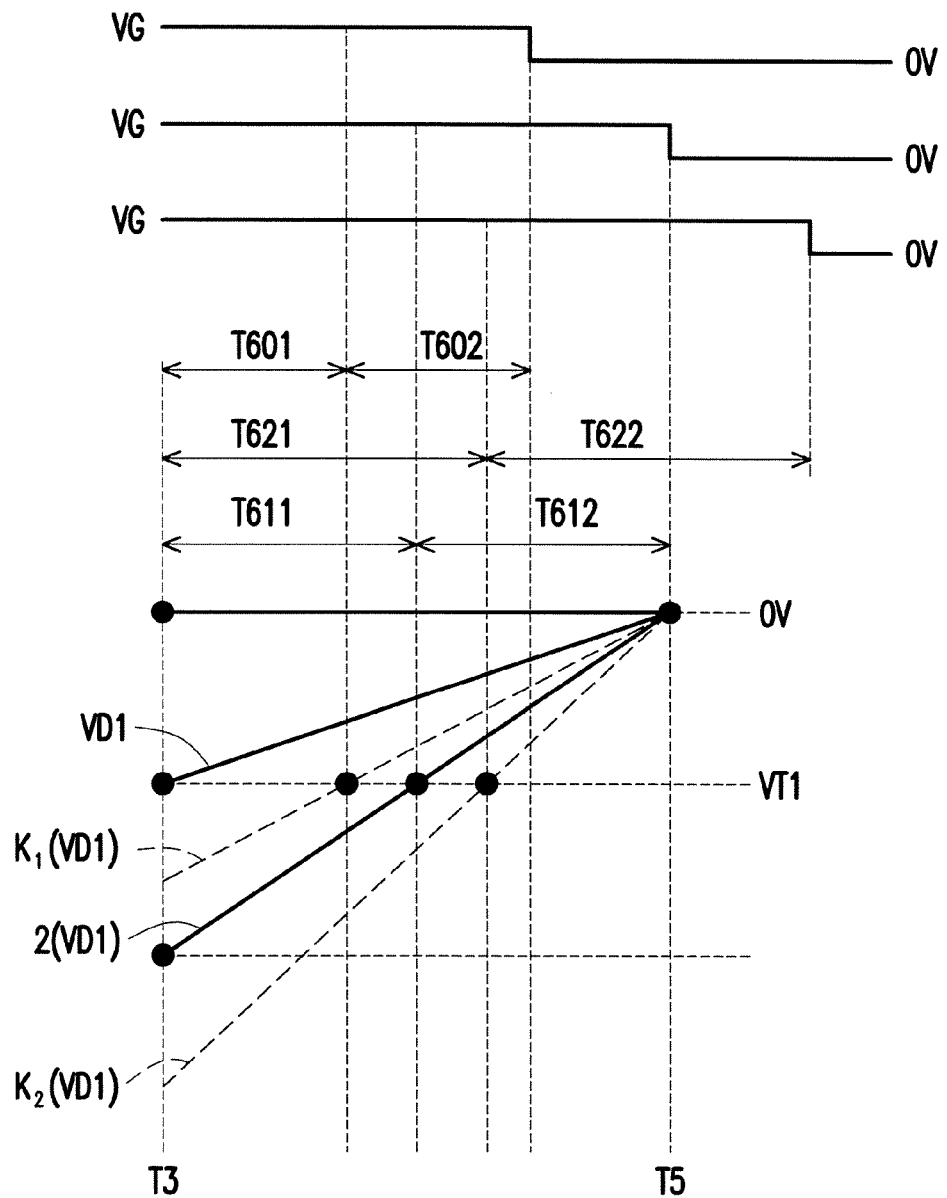
FIG. 6C is a signal timing schematic diagram of the SR controller according to still another embodiment of the invention.

For example, time lengths T601 and T602 shown in FIG. 6C are respectively the first time length TL1 and the second time length TL2 obtained when the second detection signal VD2=$K_1$(VD1), where the amplification factor $K_1$ is between 1 and 2 (which can be determined according to an actual application or an actual design requirement), and the time length T602 is equal to the time length T601. Time lengths T611 and T612 shown in FIG. 6C are respectively the first time length TL1 and the second time length TL2 obtained when the second detection signal VD2=2(VD1) where the time length T612 is equal to the time length T611. Time lengths T621 and T622 shown in FIG. 6C are respectively the first time length TL1 and the second time length TL2 obtained when the second detection signal VD2=$K_2$(VD1) where the amplification factor $K_2$ is between 2 and 3 (which can be determined according to an actual application or an actual design requirement), and the time length T622 is equal to the time length T621. Therefore, the designer may adjust the first time length TL1 and the second time length TL2 according to the amplification factor of the amplifying circuit 3621 of FIG. 5A, so as to adjust the turn-off time point of the SR transistor Msr. In this way, flexibility in circuit design is enhanced.

Figure 7A:
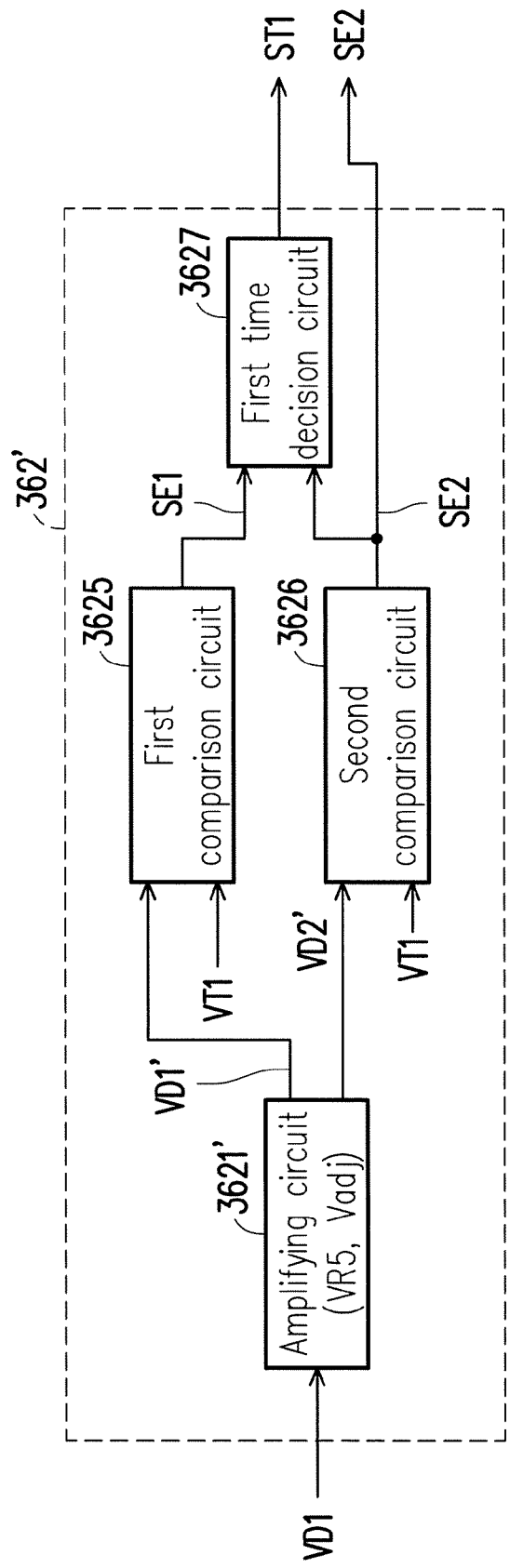
FIG. 7A is a circuit block schematic diagram of a decision circuit of the SR controller according to another embodiment of the invention.

According to another embodiment of the invention, other methods can be adopted to adjust the turn-off time point of the SR transistor Msr in case that the amplification factor of the amplifying circuit 3621 of FIG. 5A is not changed. Referring to FIG. 7A, FIG. 7A is a circuit block schematic diagram of a decision circuit 362' according to another embodiment of the invention. The decision circuit 362' may adjust the voltage value of the first detection signal VD1 to generate an adjusted signal Vadj, and takes the adjusted signal Vadj as the adjusted first detection signal VD1'. The decision circuit 362' may adjust a voltage value of the adjusted signal Vadj to generate a second detection signal VD2'. The decision circuit 362' starts counting when the voltage value of the adjusted first detection signal VD1' is equal to the voltage value of the first trigger signal VT1, and stops counting when the voltage value of the second detection signal VD2' is equal to the voltage value of the first trigger signal VT1, so as to generate the decision signal ST1, where the decision signal ST1 can be used for indicating the first time length TL1.

Further, the decision circuit 362' may include an amplifying circuit 3621', the first comparison circuit 3625, the second comparison circuit 3626 and the first time decision circuit 3627. The amplifying circuit 3621' receives the first detection signal VD1, and generates the adjusted signal Vadj to serve as the adjusted first detection signal VD1', where a voltage value of the adjusted signal Vadj is the voltage value of the first detection signal VD1 plus a predetermined voltage value VR5, and the predetermined voltage value VR5 is adjustable. Moreover, the amplifying circuit 3621' may amplify the voltage value of the adjusted signal Vadj to generate the second detection signal VD2'. In the present embodiment, a voltage value of the second detection signal VD2' can be twice of the voltage value of the adjusted signal Vadj, though the invention is not limited thereto. The first comparison circuit 3625 receives the adjusted first detection signal VD1' and the first trigger signal VT1, and compares a voltage value of the adjusted first detection signal VD1' with the voltage value of the first trigger signal VT1. When the voltage value of the adjusted first detection signal VD1' is equal to the voltage value of the first trigger signal VT1, the first comparison circuit 3625 generates the first setting signal SE1, where the first setting signal SE1 is used for indicating a time point for starting counting the first time length TL1.

The second comparison circuit 3626 receives the second detection signal VD2' and the first trigger signal VT1, and compares a voltage value of the second detection signal VD2' with the voltage value of the first trigger signal VT1. When the voltage value of the second detection signal VD2' is equal to the voltage value of the first trigger signal VT1, the second comparison circuit 3626 generates the second setting signal SE2, where the second setting signal SE2 is used for indicating a time point for stopping counting the first time length TL1 or a time point for starting counting the second time length TL2. The first time decision circuit 3627 receives the first setting signal SE1 and the second setting signal SE2, and accordingly generates the decision signal ST1. Circuit structures of the first comparison circuit 3625, the second comparison circuit 3626 and the first time decision circuit 3627 of FIG. 7A can be respectively the first comparison circuit 5625, the second comparison circuit 5626 and the first time decision circuit 5627 of FIG. 5B, so that related description thereof can be referred, and details thereof are not repeated. Implementation of the amplifying circuit 3621' is described in detail below.

Figure 7B:
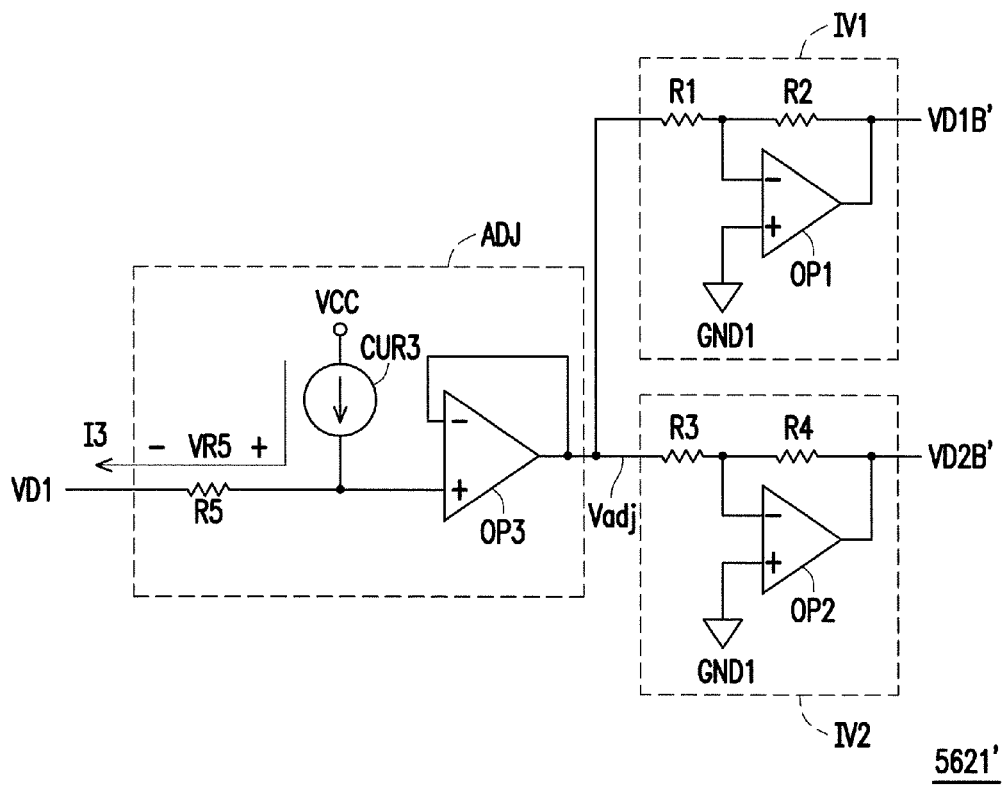
FIG. 7B is a schematic diagram of a circuit structure of an amplifying circuit according to another embodiment of the invention.
Figure 8:
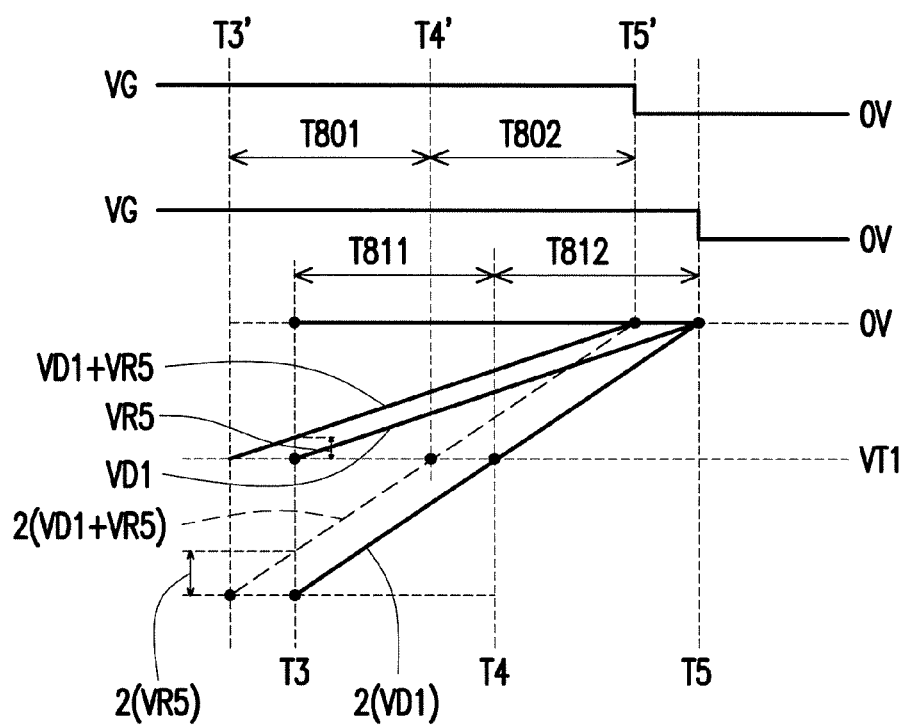
FIG. 8 is a signal timing schematic diagram of the SR controller according to still another embodiment of the invention.

Referring to FIG. 5B, FIG. 7B and FIG. 8, FIG. 7B is a schematic diagram of a circuit structure of the amplifying circuit 5621' according to another embodiment of the invention, where the amplifying circuit 5621' of FIG. 7B can be a circuit implementation of the amplifying circuit 3621' of FIG. 7A, though the invention is not limited thereto. FIG. 8 is a signal timing schematic diagram of the SR controller in which the amplifying circuit 5621' of FIG. 7B replaces the amplifying circuit 5621 of FIG. 5B, where a vertical axis of FIG. 8 represents voltage, and a horizontal axis represents time. In order to facilitate reading, only a part of the signal waveforms is illustrated in FIG. 8.

The amplifying circuit 5621' of FIG. 7B also include the first inverting amplifier IV1 and the second inverting amplifier IV2. The intention and circuit structures of the first inverting amplifier IV1 and the second inverting amplifier IV2 of FIG. 7B are respectively similar to that of the first inverting amplifier IV1 and the second inverting amplifier IV2 of FIG. 5B, so that related description of FIG. 5B can be referred, and details thereof are not repeated.

However, compared to the amplifying circuit 5621 of FIG. 5B, the amplifying circuit 5621' of FIG. 7B further includes an adjusting circuit ADJ. The adjusting circuit ADJ is used for adding the voltage value of the first detection signal VD1 by the predetermined voltage value VR5 to serve as the adjusted Vadj, where the predetermined voltage value VR5 is adjustable.

In an embodiment of the invention, the adjusting circuit ADJ may include a fifth resistor R5, a current source CUR3 and a third operation amplifier OP3, though the invention is not limited thereto. A first terminal of the fifth resistor R5 receives the first detection signal VD1. A first terminal of the current source CUR3 is coupled to the power voltage VCC. A second terminal of the current source CUR3 is coupled to a second terminal of the fifth resistor R5. The current source CUR3 is used for generating an adjusting current I3, so as to produce a cross voltage at two terminals of the fifth resistor R5 to serve as the predetermined voltage value VR5.

A non-inverted input terminal of the third operation amplifier OP3 is coupled to the second terminal of the fifth resistor R5. An inverted input terminal of the third operation amplifier OP3 is coupled to an output terminal of the third operation amplifier OP3 to generate the adjusting signal Vadj, where the adjusting signal Vadj is shown as a following equation (3). The first inverting amplifier IV1 may invert the adjusting signal Vadj to generate the inverted first detection signal VD1B'. The second inverting amplifier IV2 may amplify the adjusting signal Vadj by twice and invert the same to generate the inverted second detection signal VD2B', as shown by a following equation (4).

$$V_{adj} = VD1 + VR5 \qquad \text{equation (3)}$$

$$VD2B' = -2(VD1 + VR5) \qquad \text{equation (4)}$$

In an embodiment of the invention, the current source CUR3 can be an adjustable current source. Alternatively, the fifth resistor R5 can be a variable resistor. In this way, the designer may adjust the cross voltage (i.e. the predetermined voltage value VR5) between the two terminals of the fifth resistor R5 by adjusting the current value of the current source CUR3 or the resistance of the fifth resistor R5, such that the inverted first detection signal VD1B' has a shifting variation of −(VR5), and the voltage value of the inverted second detection signal VD2B' has a shifting variation of −2(VR5).

Since the voltage value of the inverted first detection signal VD1B' generated by the amplifying circuit 5621' of FIG. 7B can be fine tuned, the time point for starting counting the first time length TL1 may occur in advance, as shown by a time point T3' of FIG. 8. Moreover, since the voltage value of the inverted second detection signal VD2B' generated by the amplifying circuit 5621' can be fine tuned, the time point for stopping counting the first time length TL1 and the time point for starting counting the second time length TL2 may occur in advance, as shown by a time point T4' of FIG. 8. Moreover, since the second time length TL2 is equal to the first time length TL1, the time point (i.e. the time point T4') for starting counting the second time length TL2 and the time point (i.e. the time point T5') for stopping counting the second time length TL2 accordingly occur in advance. Therefore, the designer may adjust the turn-off time point of the SR transistor Msr by adjusting the current value of the current source CUR3 or the resistance of the fifth resistor R5. In this way, the flexibility of circuit design is enhanced. Time lengths T801 and T802 shown in FIG. 8 are respectively the first time length TL1 and the second time length TL2 obtained when the second detection signal VD2B'=−2(VD1+VR5), and the time length T802 is equal to the time length T801. Time lengths T811 and T812 shown in FIG. 8 are respectively the first time length TL1 and the second time length TL2 obtained when the second detection signal VD2B'=−2(VD1), and the time length T812 is equal to the time length T811.

Figure 9:
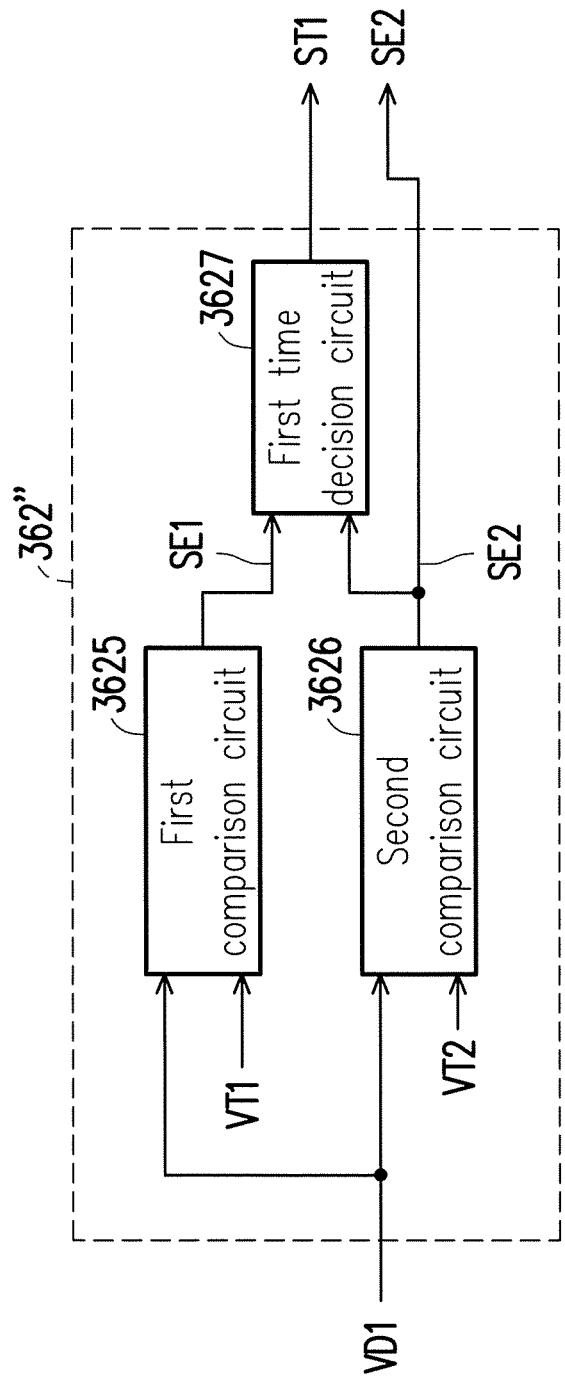
FIG. 9 is a circuit block schematic diagram of a decision circuit of the SR controller according to still another embodiment of the invention.

Referring to FIG. 9, FIG. 9 is a circuit block schematic diagram of a decision circuit 362" according to still another embodiment of the invention. The decision circuit 362" starts counting when the voltage value of the first detection signal VD1 is equal to the voltage value of the first trigger signal VT1, and stops counting when the voltage value of the first detection signal VD1 is equal to the voltage value of the second trigger signal VT2, so as to generate the decision signal ST1, where the decision signal ST1 is used for indicating the first time length TL1.

Further, the decision circuit 362" may include the first comparison circuit 3625, the second comparison circuit 3626 and the first time decision circuit 3627. The first comparison circuit 3625 receives the first detection signal VD1 and the first trigger signal VT1, and compares a voltage value of the first detection signal VD1 with the voltage value of the first trigger signal VT1. When the voltage value of the first detection signal VD1 is equal to the voltage value of the first trigger signal VT1, the first comparison circuit 3625 generates the first setting signal SE1, where the first setting signal SE1 is used for indicating a time point for starting counting the first time length TL1.

The second comparison circuit 3626 receives the first detection signal VD1 and the second trigger signal VT2, and compares the voltage value of the first detection signal VD1 with the voltage value of the second trigger signal VT2. When the voltage value of the first detection signal VD1 is equal to the voltage value of the second trigger signal VT2, the second comparison circuit 3626 generates the second setting signal SE2, where the second setting signal SE2 is used for indicating a time point for stopping counting the first time length TL1 or a time point for starting counting the second time length TL2. The first time decision circuit 3627 receives the first setting signal SE1 and the second setting signal SE2, and accordingly generates the decision signal ST1.

Figure 10:
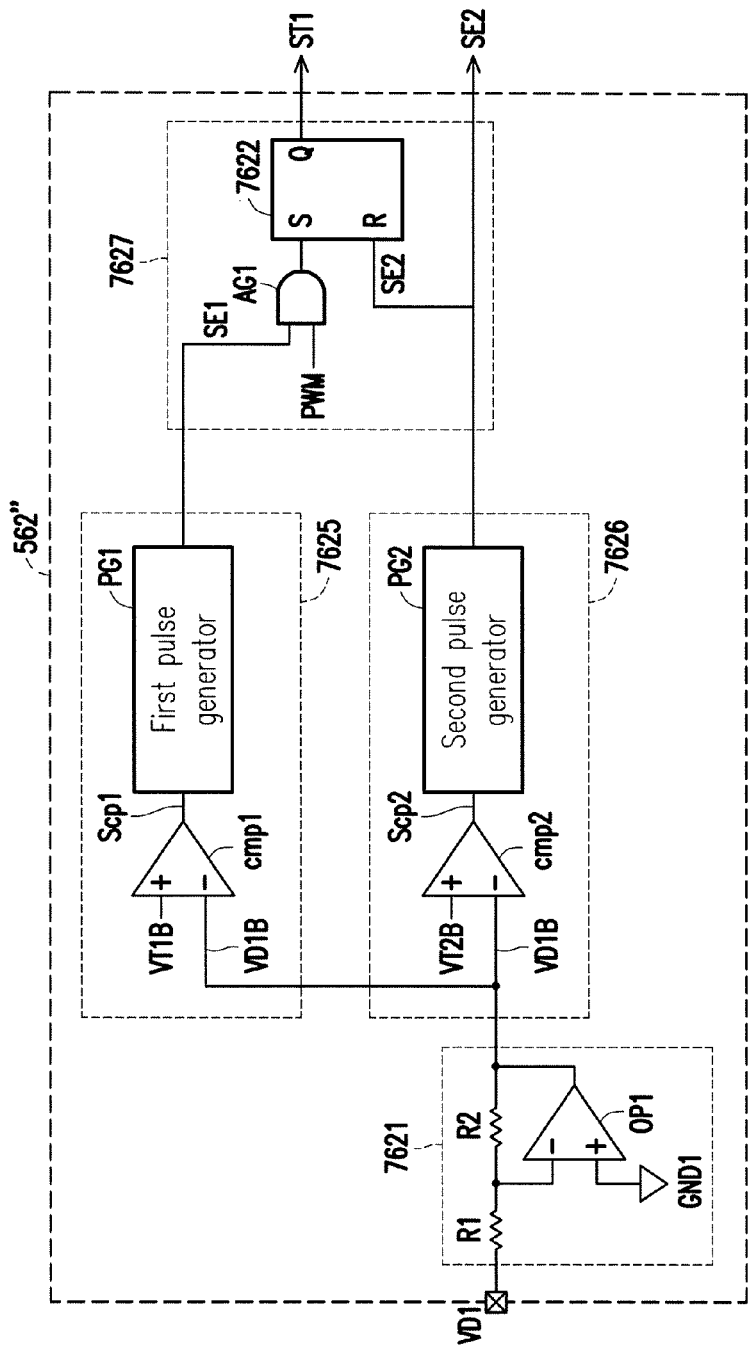
FIG. 10 is a schematic diagram of a circuit structure of a decision circuit of the SR controller according to another embodiment of the invention.
Figure 11:
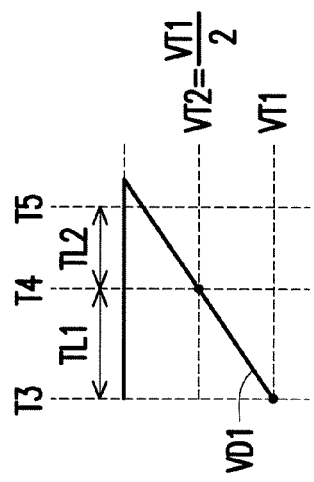
FIG. 11 is a signal timing schematic diagram of the SR controller according to still another embodiment of the invention.
Figure 11:
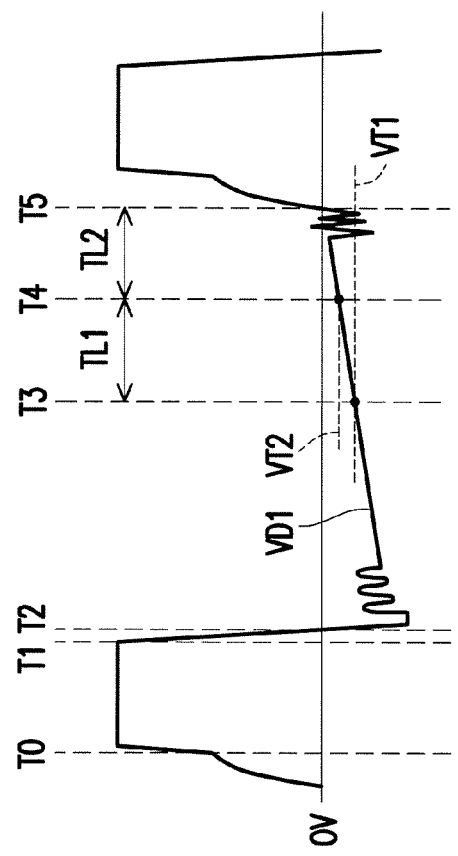

In detail, referring to FIG. 5B, FIG. 10 and FIG. 11, FIG. 10 is a schematic diagram of a circuit structure of a decision circuit 562" according to another embodiment of the invention. The decision circuit 562" of FIG. 10 can be a circuit implementation of the decision circuit 362" of FIG. 9, though the invention is not limited thereto. FIG. 11 is schematic diagram of signal waveforms of the SR controller in which the decision circuit 562" of FIG. 10 replaces the decision circuit 562 of FIG. 5B, where a vertical axis of FIG. 11 represents voltage, and a horizontal axis represents time. In order to facilitate reading, a right part of FIG. 11 is a partial enlarged view of a left part of FIG. 11 from the time point T3 to the time point T5, and the noise on the first detection signal VD1 is omitted.

In the present embodiment, the voltage value of the second trigger signal VT2 can be set to a half of the voltage value of the first trigger signal VT1, so as to obtain the first time length TL1 accordingly. Then, the second time length TL2 can be deduced according to the triangular geometry operation, where the second time length TL2 is equal to the first time length TL1.

In detail, as shown in FIG. 10, the decision circuit 562" may include an inverting circuit 7621, a first comparison circuit 7625, a second comparison circuit 7626 and a first time decision circuit 7627. The intention of the inverting circuit 7621 is similar to the first inverting amplifier IV1 and the second inverting amplifier IV2 of FIG. 5B, so that related description of FIG. 5B can be referred, and detail thereof is not repeated. The inverting circuit 7621 receives the first detection signal VD1, and accordingly generate the inverted first detection signal VD1B. The inverting circuit 7621 may include a first operation amplifier OP1, a first resistor R1 and a second resistor R2. A first terminal of the first resistor R1 receives the first detection signal VD1. A second terminal of the first resistor R1 is coupled to an inverted input terminal of the first operation amplifier OP1. A non-inverted input terminal of the first operation amplifier OP1 is coupled to the first ground terminal GND1. A first terminal of the second resistor R2 is coupled to the inverted input terminal of the first operation amplifier OP1. A second terminal of the second resistor R2 is coupled to an output terminal of the first operation amplifier OP1 to generate the inverted first detection signal VD1B, where a resistance of the second resistor R2 is equal to a resistance of the first resistor R1. It should be noted that an absolute gain value of the inverting circuit 7621 is 1.

The first comparison circuit 7625 may include a first comparator cmp1 and a first pulse generator PG1. An inverted input terminal of the first comparator cmp1 receives the inverted first detection signal VD1B. A non-inverted input terminal of the first comparator cmp1 receives the inverted first trigger signal VT1B. An output terminal of the first comparator cmp1 generates the first comparison signal Scp1. The first pulse generator PG1 is coupled to the output terminal of the first comparator cmp1 to receive the first comparison signal Scp1, and accordingly generates the first setting signal SE1.

The second comparison circuit 7626 may include a second comparator cmp2 and a second pulse generator PG2. An inverted input terminal of the second comparator cmp2 receives the inverted first detection signal VD1B. A non-inverted input terminal of the second comparator cmp2 receives the inverted second trigger signal VT2B, where the voltage value of the inverted second trigger signal VT2B is a half of the voltage value of the inverted first detection signal VD1B. An output terminal of the second comparator cmp2 generates the second comparison signal Scp2. The second pulse generator PG2 is coupled to the output terminal of the second comparator cmp2 to receive the second comparison signal Scp2, and accordingly generates the second setting signal SE2.

The first time decision circuit 7627 may include an AND gate AG1 and an SR latch 7622. A first input terminal of the AND gate AG1 is coupled to the first pulse generator PG1 to receive the first setting signal SE1. A second input terminal of the AND gate AG1 receives the pulse width modulation signal PWM. A setting terminal S of the SR latch 7622 is coupled to an output terminal of the AND gate AG1. A reset terminal R of the SR latch 7622 is coupled to the second pulse generator PG2 to receive the second setting signal SE2. A positive output terminal Q of the SR latch 7622 generates the decision signal ST1.

In overall, in the present embodiment, the time point T3 that the voltage value of the first detection signal VD1 reaches the voltage value of the first trigger signal VT1 is recorded, and the time point T4 that the voltage value of the first detection signal VD1 reaches the voltage value of the second trigger signal VT2 is recorded, so as to obtain the first time length TL1, as shown in FIG. 11. Since the voltage value of the second trigger signal VT2 is a half of the voltage value of the first trigger signal VT1, it can be deduced that the second time length TL2 is equal to the first time length TL1 according to the triangular geometry operation, and then counting from the time point T4, such that the SR transistor Msr is turned off after the counting value reaches the second time length TL2.

In summary, the SR controller of the embodiment of the invention is adapted to obtain the first time length according to the voltage value of the first detection signal, the voltage value of the first trigger signal and the voltage value of the second trigger signal, and then deduces a time point for turning off the SR transistor according to the first time length and a triangular geometry operation. Since the first detection signal has a larger noise when the voltage value thereof is increased to approach 0 volt, in determination of the time point for turning off the SR transistor, the SR controller of the invention is adapted to decrease the influence caused by the above noise. Moreover, the designer may control and adjust the time point for turning off the SR transistor according to an actual application or an actual design requirement, which improves design flexibility.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A power conversion apparatus, comprising:
   a transformer, having a primary side and at least one secondary side, wherein the primary side is used for receiving an input voltage, and each of the at least one secondary side is used for providing an output voltage to a corresponding output terminal;
   at least one synchronous rectification transistor, each of the at least one synchronous rectification transistor being coupled between one of the at least one secondary side and the corresponding output terminal, and each of the at least one synchronous rectification transistor is controlled by a switch signal; and
   at least one synchronous rectification controller, each of the at least one synchronous rectification controller being coupled to a corresponding one of the at least one synchronous rectification transistor, and receiving a cross voltage between a drain terminal and a source terminal of the corresponding synchronous rectification transistor to serve as a first detection signal,
   wherein each of the at least one synchronous rectification controller obtains a first time length according to a voltage value of the first detection signal, a voltage value of a first trigger signal and a voltage value of a second trigger signal, and determines a second time length according to the first time length,
   wherein each of the at least one synchronous rectification controller starts counting when the voltage value of the first detection signal is equal to the voltage value of the first trigger signal, and generates the switch signal to turn off the corresponding synchronous rectification transistor when a counting value counted by the synchronous rectification controller reaches a sum of the first time length and the second time length.

2. The power conversion apparatus as claimed in claim 1, wherein each of the at least one synchronous rectification controller comprises:
   a decision circuit, starting counting when the voltage value of the first detection signal is equal to the voltage value of the first trigger signal, and stopping counting when the voltage value of the first detection signal is equal to the voltage value of the second trigger signal, so as to generate a decision signal accordingly, wherein the decision signal is used for indicating the first time length;
   a prediction circuit, coupled to the decision circuit to receive the decision signal, the prediction circuit obtaining the first time length according to the decision signal, and accordingly determining the second time length, wherein the prediction circuit starts counting according to the decision signal at a time point when the first time length is ended, and generates a reset signal when a counting value counted by the prediction circuit reaches the second time length; and
   a gate driving circuit, coupled to the prediction circuit to receive the reset signal, and generating the switch signal according to the reset signal, so as to turn off the corresponding synchronous rectification transistor.

3. The power conversion apparatus as claimed in claim 2, wherein the voltage value of the second trigger signal is a half of the voltage value of the first trigger signal, wherein the decision circuit comprises:
   a first comparison circuit, receiving the first detection signal and the first trigger signal, and comparing the voltage value of the first detection signal with the voltage value of the first trigger signal, wherein when the voltage value of the first detection signal is equal to the voltage value of the first trigger signal, the first comparison circuit generates a first setting signal;
   a second comparison circuit, receiving the first detection signal and the second trigger signal, and comparing the voltage value of the first detection signal with the voltage value of the second trigger signal, wherein when the voltage value of the first detection signal is equal to the voltage value of the second trigger signal, the second comparison circuit generates a second setting signal; and
   a first time decision circuit, receiving the first setting signal and the second setting signal, and accordingly generating the decision signal.

4. The power conversion apparatus as claimed in claim 3, wherein the prediction circuit comprises:
   a second time decision circuit, obtaining the first time length according to the decision signal, and setting the second time length to be equal to the first time length, wherein the second time decision circuit starts counting according to the second setting signal when the voltage value of the first detection signal is equal to the voltage value of the second trigger signal, and generates the reset signal when a counting value counted by the second time decision circuit reaches the second time length.

5. The power conversion apparatus as claimed in claim 1, wherein the second trigger signal is the first trigger signal, wherein each of the at least one synchronous rectification controller comprises:
   a decision circuit, adjusting the voltage value of the first detection signal to generate a second detection signal, the decision circuit starting counting when the voltage value of the first detection signal is equal to the voltage value of the first trigger signal, and stopping counting when the voltage value of the second detection signal is equal to the voltage value of the first trigger signal, so as to generate a decision signal, wherein the decision signal is used for indicating the first time length;
   a prediction circuit, coupled to the decision circuit to receive the decision signal, the prediction circuit obtaining the first time length according to the decision signal, and accordingly determining the second time length, wherein the prediction circuit starts counting according to the decision signal at a time point when the first time length is ended, and generates a reset signal when a counting value counted by the prediction circuit reaches the second time length; and
   a gate driving circuit, coupled to the prediction circuit to receive the reset signal, and generating the switch signal according to the reset signal, so as to turn off the corresponding synchronous rectification transistor.

6. The power conversion apparatus as claimed in claim 5, wherein the decision circuit comprises:
   an amplifying circuit, receiving the first detection signal, and amplifying the first detection signal to generate the second detection signal;
   a first comparison circuit, receiving the first detection signal and the first trigger signal, and comparing the voltage value of the first detection signal with the voltage value of the first trigger signal, wherein when the voltage value of the first detection signal is equal to the voltage value of the first trigger signal, the first comparison circuit generates a first setting signal;
   a second comparison circuit, receiving the second detection signal and the first trigger signal, and comparing a voltage value of the second detection signal with the voltage value of the first trigger signal, wherein when the voltage value of the second detection signal is equal to the voltage value of the first trigger signal, the second comparison circuit generates a second setting signal; and
a first time decision circuit, receiving the first setting signal and the second setting signal, and accordingly generating the decision signal.

7. The power conversion apparatus as claimed in claim 6, wherein a multiple between the voltage value of the second detection signal and the voltage value of the first detection signal is adjustable, such that the first time length is adjustable, wherein the prediction circuit comprises:
a second time decision circuit, obtaining the adjustable first time length according to the decision signal, and setting the second time length to be equal to the first time length, wherein the second time decision circuit starts counting according to the second setting signal when the voltage value of the second detection signal is equal to the voltage value of the first trigger signal, and generates the reset signal when a counting value counted by the second time decision circuit reaches the second time length.

8. The power conversion apparatus as claimed in claim 6, wherein the voltage value of the second detection signal is N times of the voltage value of the first detection circuit, and N is a real number greater than 1, wherein the prediction circuit comprises:
a second time decision circuit, obtaining the first time length according to the decision signal, and setting the second time length to be equal to $1/(N-1)$ times of the first time length, wherein the second time decision circuit starts counting according to the second setting signal when the voltage value of the second detection signal is equal to the voltage value of the first trigger signal, and generates the reset signal when a counting value counted by the second time decision circuit reaches the second time length.

9. The power conversion apparatus as claimed in claim 1, wherein the second trigger signal is the first trigger signal, wherein each of the at least one synchronous rectification controller comprises:
a decision circuit, adjusting the voltage value of the first detection signal to generate an adjusted signal, and adjusting a voltage value of the adjusted signal to generate the second detection signal, the decision circuit starting counting when the voltage value of the adjusted signal is equal to the voltage value of the first trigger signal, and stopping counting when the voltage value of the second detection signal is equal to the voltage value of the first trigger signal, so as to generate a decision signal, wherein the decision signal is used for indicating the first time length;
a prediction circuit, coupled to the decision circuit to receive the decision signal, the prediction circuit obtaining the first time length according to the decision signal, and accordingly determining the second time length, wherein the prediction circuit starts counting according to the decision signal at a time point when the first time length is ended, and generates a reset signal when a counting value counted by the prediction circuit reaches the second time length; and
a gate driving circuit, coupled to the prediction circuit to receive the reset signal, and generating the switch signal according to the reset signal, so as to turn off the corresponding synchronous rectification transistor.

10. The power conversion apparatus as claimed in claim 9, wherein the decision circuit comprises:
an amplifying circuit, receiving the first detection signal, adding the voltage value of the first detection signal by a predetermined voltage value to serve as the adjusted signal, and amplifying the voltage value of the adjusted signal to generate the second detection signal;
a first comparison circuit, receiving the adjusted signal and the first trigger signal, and comparing the voltage value of the adjusted signal with the voltage value of the first trigger signal, wherein when the voltage value of the adjusted signal is equal to the voltage value of the first trigger signal, the first comparison circuit generates a first setting signal;
a second comparison circuit, receiving the second detection signal and the first trigger signal, and comparing a voltage value of the second detection signal with the voltage value of the first trigger signal, wherein when the voltage value of the second detection signal is equal to the voltage value of the first trigger signal, the second comparison circuit generates a second setting signal; and
a first time decision circuit, receiving the first setting signal and the second setting signal, and accordingly generating the decision signal.

* * * * *